(12) United States Patent
Liepold

(10) Patent No.: US 8,202,747 B2
(45) Date of Patent: Jun. 19, 2012

(54) METHOD FOR ARRANGING A POWDER LAYER ON A SUBSTRATE AND LAYER STRUCTURE WITH AT LEAST ONE POWDER LAYER ON A SUBSTRATE

(75) Inventor: Ute Liepold, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 459 days.

(21) Appl. No.: 12/303,928

(22) PCT Filed: Jun. 6, 2007

(86) PCT No.: PCT/DE2007/001012
§ 371 (c)(1),
(2), (4) Date: May 12, 2009

(87) PCT Pub. No.: WO2007/140766
PCT Pub. Date: Dec. 13, 2007

(65) Prior Publication Data
US 2010/0224893 A1 Sep. 9, 2010

(30) Foreign Application Priority Data
Jun. 7, 2006 (DE) .......................... 10 2006 026 481

(51) Int. Cl.
*H01L 21/00* (2006.01)
(52) U.S. Cl. .......................................... 438/29; 438/22
(58) Field of Classification Search .................... 438/22, 438/29; 427/96.1, 99.2, 157
See application file for complete search history.

(56) References Cited

U.S. PATENT DOCUMENTS

| 5,441,818 | A | 8/1995 | Kadokura |
| 6,613,247 | B1 * | 9/2003 | Hohn et al. ............... 252/301.36 |
| 6,753,646 | B1 * | 6/2004 | Liu et al. ....................... 313/512 |
| 2004/0130264 | A1 | 7/2004 | Liu et al. |
| 2005/0184651 | A1 | 8/2005 | Cheng et al. |
| 2006/0097621 | A1 | 5/2006 | Park et al. |

FOREIGN PATENT DOCUMENTS

| DE | 101 09 349 | 9/2002 |
| DE | 20 2005 002 110 | 6/2005 |
| DE | 102005040522 | 3/2006 |
| EP | 1 586 676 | 10/2005 |
| EP | 1 609 835 | 12/2005 |
| JP | 6182635 | 7/1994 |
| JP | 2000 031532 | 1/2000 |
| JP | 2002-324682 | 11/2002 |
| JP | 2003 298116 | 10/2003 |

(Continued)

OTHER PUBLICATIONS

Taiwanese Examination Report dated Jul. 4, 2011.

*Primary Examiner* — Kevin M Picardat
(74) *Attorney, Agent, or Firm* — Cozen O'Connor

(57) ABSTRACT

A process for arranging a powder layer comprising a powder on a substrate surface of a substrate. A substrate having a substrate surface is provided, and a mixture comprising the powder and an adhesion promoter is applied on the substrate surface. The adhesion promoter is removed and the powder layer is fixed on the substrate surface.

15 Claims, 3 Drawing Sheets

FOREIGN PATENT DOCUMENTS

| | | |
|---|---|---|
| JP | 2005 236302 | 9/2005 |
| JP | 2007 049114 | 2/2007 |
| TW | 583777 | 4/2004 |
| TW | 595012 | 6/2004 |
| TW | I227568 | 2/2005 |
| TW | I246776 | 1/2006 |
| TW | I249860 | 2/2006 |
| WO | WO 2006/034663 | 4/2006 |

\* cited by examiner

US 8,202,747 B2

METHOD FOR ARRANGING A POWDER LAYER ON A SUBSTRATE AND LAYER STRUCTURE WITH AT LEAST ONE POWDER LAYER ON A SUBSTRATE

RELATED APPLICATIONS

This is a U.S. national stage under 35 USC §371 of application No. PCT/DE2007/001012, filed on Jun. 6, 2007.

This application claims the priority of German application no. 10 2006 026 481.9 filed Jun. 7, 2006 the entire content of which is hereby incorporated by reference.

FIELD OF THE INVENTION

The invention relates to a process for arranging a powder layer on a substrate surface of a substrate. Additionally specified is a layer structure comprising at least one powder layer on a substrate surface of a substrate.

BACKGROUND OF THE INVENTION

The substrate is, for example, a semiconductor component. The semiconductor component is, for example, a conversion LED. A conversion LED may comprise an LED (light-emitting diode), on whose surface, which may thus constitute the abovementioned substrate surface, a converter layer is applied. There is a layer structure composed of the semiconductor component and the converter layer. The converter layer comprises, for example, a ceramic phosphor powder. A phosphor of the phosphor powder has the task of converting the electromagnetic primary radiation which is emitted by the LED to electromagnetic secondary radiation.

To produce the layer structure, proceeding from a semiconductor substrate which may have a multitude of LEDs (wafer), the converter layer is applied to a semiconductor surface of the semiconductor substrate. However, it may be possible that not all LEDs of the semiconductor substrate are suitable for conversion LEDs. The converter layer should be removable again in a simple manner from the surface thereof.

SUMMARY OF THE INVENTION

It is therefore an object of the present invention to specify a process for arranging a powder layer on a substrate surface of a substrate, wherein the powder layer can be removed easily at particular points on the substrate surface.

To solve the problem, a process is specified for arranging a powder layer comprising a powder on a substrate surface of a substrate, comprising the following process steps:
a) providing the substrate with the substrate surface,
b) applying a mixture comprising the powder and an adhesion promoter on the substrate surface,
c) removing the adhesion promoter and
d) fixing the powder layer on the substrate surface.

The process makes it possible to obtain a new kind of layer structure comprising at least one structured powder layer comprising powder on a substrate surface of a substrate.

The process according to at least one of the following embodiments can produce a novel layer structure having at least one patterned powder layer comprising powder on a substrate surface of a substrate. It is possible to obtain a loosely adhering powder layer on the substrate surface. Subsequently, the powder layer can be fixed. Before or after the fixing, patterning of the powder layer may take place. At least one embodiment of the process may find use especially in the production of conversion LEDs. The powder layer may constitute a converter layer applied to an LED. In the production of conversion LEDs, semiconductor wafers comprising a multitude of LEDs can be used. The converter layer can be obtained in a controlled manner in particular regions of the surface of the wafer.

A basic idea consists in first applying the powder layer such that it can be easily removed again. This is possible with the adhesion promoter. The adhesion promoter can be removed readily. The removal of the adhesion promoter gives rise to slight adhesion of the powder particles to the substrate surface and adhesion of the powder particles to one another. Slight adhesion is based, for example, on weak adhesive and cohesive forces (e.g. van der Waals forces). By virtue of the weak adhesive and cohesive forces, the powder layer can be removed again in a simple manner.

Conceivable adhesion promoters include any materials which keep the powder on the substrate surface and which contribute to layer formation. More particularly, the adhesion promoter is selected from the group of water, organic solvent, inorganic binder and organic binder. The organic solvent is, for example, an alcohol, an ester or a ketone. With the powder, these adhesion promoters form, for example, dispersions. A binder may be notable in that it is crosslinkable and hence leads to layer formation. Crosslinking proceeds, for example, as the binder is cured. The inorganic binder is, for example, waterglass ($Na_2SiO_3$ or $K_2SiO_3$). The organic binder is, for example, an acrylic binder. It is also possible to use mixtures of the adhesion promoters mentioned. For example, the adhesion promoter used may be a mixture of water and an alcohol. Also conceivable is a mixture of organic binder and organic solvent, for example an acrylic binder and ketone.

Depending on the adhesion promoter used, it is possible to use different processes in order to remove the adhesion promoter. In the simplest case, when a solvent is used (water or organic solvents), it is merely necessary to increase the temperature and/or to lower an ambient pressure in order to remove the solvent from the substrate surface. When, in contrast, an organic binder is used, the temperature is increased, such that the binder burns off. The binder is selected such that the temperature at which the binder burns off is matched to the temperature up to which the substrate is stable. In the case of a semiconductor substrate, it is possible, for example, to use a binder which burns off at relatively low temperature (up to not more than 350° C.). In the case of a substrate made of glass, it is ensured that the binder burns off at a temperature below the softening point of the glass of the substrate.

For application of the mixture comprising the powder and the adhesion promoter to the substrate surface, a wide variety of different processes is conceivable. Selection of the process is guided by factors including the powder used, the adhesion promoter used and the substrate surface of the substrate.

For example, to apply the mixture, a printing process can be carried out. The printing process is, for example, a screen-printing process. In this case, the mixture is a printable paste comprising the powder and an organic binder as an adhesion promoter. This paste is printed onto the substrate surface of the substrate.

Further, an electrophoresis process can be performed to apply the mixture. The powder particles of the powder are applied to the substrate surface electrophoretically, i.e. by applying an electrical field. The electrical field is applied, for example, by means of an electrically conductive substrate surface. For the electrophoresis process, preference is given to using adhesion promoters in the form of polar solvents (e.g. water and/or alcohol).

Further, it is possible to apply the mixture by performing a sedimentation process. In this process, for example, the substrate is immersed into a vessel comprising the mixture of adhesion promoter, for example a solvent, and powder. The substrate surface is wetted and/or covered by the mixture. Different densities of powder and adhesion promoter, for example the solvent, result in sedimentation. The powder "falls" onto the substrate surface and is deposited there. After the deposition, the adhesion promoter, for example the solvent, is removed. With the aid of this process, it is possible to achieve a homogeneous powder layer. The sedimentation can be influenced by adjusting the density of the solvent.

Further, a further binder can be applied to the powder layer for fixing. The further binder is applied, for example, by dripping, spraying, stamping and printing. The further binder is notable in that it permeates the powder layer applied, i.e. is deposited in interstices of the powder layer, and fixes the powder layer on the substrate. For this purpose, it is possible to use, for example, an organic binder which, after being applied to the powder layer, can be cured thermally and/or optically. In addition, it may, for example, be possible to use waterglass as a further binder. In conjunction with a semiconductor substrate, a silicone-comprising binder has been found to be a useful further binder. Therefore, a further binder may be a silicone-comprising binder or silicone.

Further, the application of the mixture, the removal of the adhesion promoter and/or the fixing of the powder layer can be performed area by area, i.e. in a patterned manner. The mixture can be applied to particular areas of the substrate surface. However, preference is given to removing particular (desired) areas and/or to fixing particular areas of the loosely adhering and/or slightly adhering powder layer applied.

For example, the mixture is first applied over a large area. Subsequently, by removing the adhesion promoter, a loosely adhering powder layer is obtained over a large area. Later, areas of the loosely adhering powder layer are removed. The loosely adhering powder layer is patterned. The powder layer is removed, for example, by brushing, scraping or by rinsing with liquids or with gases. The areas of the initially loosely adhering powder layer remaining on the substrate surface are fixed. Alternatively, an unstructured, loosely adhering powder layer is applied. After removal of the adhesion promoter, particular areas of the loosely adhering powder layer are fixed. After removal of the residual loosely adhering areas of the powder layer, what remains is a patterned, fixed powder layer on the substrate surface. In the listed processes, masks may be used. The listed patterning means may be performed individually or in combination with one another.

The powder may consist of any organic or inorganic material. For example, the powder is a metal powder. Preference is given to using a ceramic powder as the powder. For example, the ceramic powder used is a powder comprising a ceramic phosphor. Ceramic phosphors may be used, for example, as described above, in converter layers of conversion LEDs.

The process can be performed once. This means that a single powder layer is applied to the substrate surface of the substrate. It is also conceivable that the entire process or individual process steps can be performed more than once. As a result, it is possible, for example, to obtain a multiply-layered powder layer. It is possible, for instance, to perform process steps b) and c) repeatedly with different powders, such that a multilayer structure with a plurality of powder layers comprising the different powders arranged one on top of another can arise. Process step d) can finally be performed once. It is thus possible for all loosely adhering powder layers applied to be fixed once. It may also be possible that, after process steps b) and c), the powder layer loosely applied in each case may be fixed each time. It may therefore be possible, in addition to process steps b) and c), to perform process step d) repeatedly.

The substrate used may be any desired substrate. For example, the substrate is a ceramic substrate or a glass substrate. In addition, the substrate used may be a semiconductor substrate. In that case, the semiconductor substrate may consist only of one semiconductor component. A semiconductor substrate may comprise a multitude of semiconductor components. The substrate may comprise a wafer or be a wafer. The loosely adhering powder layer may be applied to a large area of a wafer surface of the wafer.

Especially in the case of use of a semiconductor substrate comprising a multitude of semiconductor components, the fixing of the loosely adhering powder layer can be carried out before or after the individualization of the wafer into individual semiconductor components. When the fixing is performed only after the individualization, it may be necessary, or it should possibly be ensured, that adhesive strength of the loosely adhering powder layer sufficient for the individualization (for example by sawing), is ensured.

The above-described process, at least in some embodiments, may have one or more of the following advantages:

With the aid of the adhesion promoter, the powder layer can be applied in a loosely adhering and hence readily removable manner to the substrate surface of the substrate. This may be advantageous especially in connection with conversion LEDs: this is because the alternative would be the need to remove the converter layer from the LED surface by thermally burning off a binder of the converter layer. However, this may not be possible in the case of conversion LEDs, since the binders with suitable optical properties used have, for example, sufficient stability toward electromagnetic primary radiation and possibly do not burn out up to very high temperatures, and the LEDs, in contrast, are stable, for example, only up to a maximum of 400° C.

With the aid of at least one embodiment of the process, it is possible to arrange a powder layer in structured form on a substrate surface of a substrate. This is particularly advantageous in connection with the processing of whole wafers. In the production process, the resources available can be exploited optimally.

At least one embodiment of the process may be particularly advantageous in the application of converter layers to LEDs: a thickness of the powder layer can be altered very easily by the process described, for example by repeated application of powder layers or by subsequent thinning of the loosely adhering powder layer. An alternation in the thickness of the converter layer allows a color locus (emission wavelength) of the conversion LED to be adjustable.

BRIEF DESCRIPTION OF THE DRAWINGS

Further advantages and advantageous embodiments and developments of the invention are illustrated in detail with reference to the embodiments which follow and the accompanying figures. The figures are schematic and do not constitute scale illustrations.

The figures show in

DETAILED DESCRIPTION OF THE DRAWINGS

Figure 1:
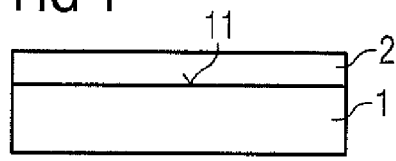
FIG. 1 a schematic illustration of a layer structure according to an embodiment, FIGS. 2A to 2E a schematic illustration of a process for producing a layer structure in a further embodiment, FIGS. 3A and 3B schematic illustrations of individual steps of a process according to further embodiments, and FIGS. 4A to 4E a schematic illustration of a process of layer structuring according to a further embodiment.

FIG. 1 shows a layer structure consisting of a substrate 1 having a substrate surface 11 on which has been applied a powder layer 2. The substrate is an LED. The powder layer is a converter layer comprising a ceramic phosphor.

Figure 2A:
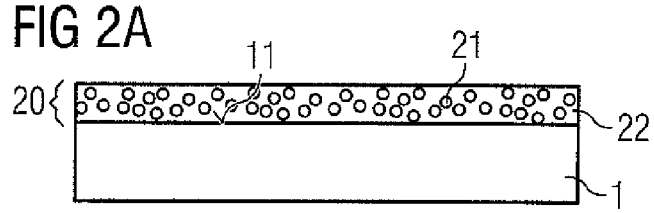

To arrange the converter layer on the LED, the procedure is as shown in FIGS. 2A to 2E which follow: a mixture of the phosphor 21 and an acrylic binder which burns off at low temperature as an adhesion promoter 22 is prepared: this results in a paste 20 which is printed or knife-coated onto the substrate surface 11 of the substrate 1 (FIG. 2A). Subsequently, the binder 22 is cured. This gives rise to a sufficiently firmly adhering powder layer which withstands mechanical stresses of possible subsequent steps (for example individualization).

Figure 2B:
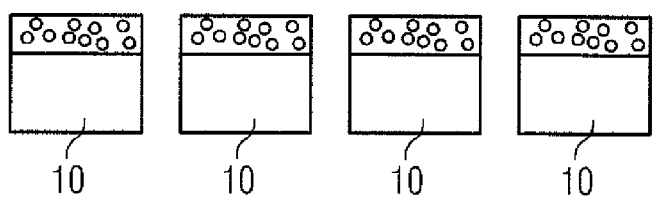
Figure 2C:
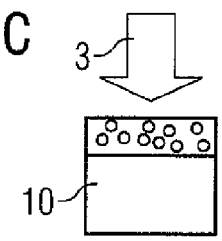
Figure 2D:
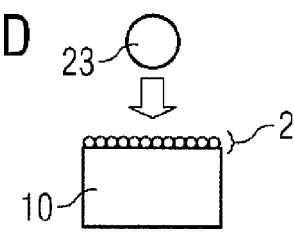
Figure 2E:
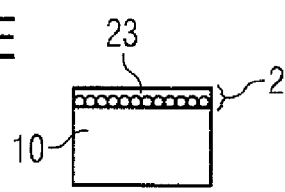

Thereafter, individualization into individual semiconductor components 10 takes place (FIG. 2B). After the separation and sorting of the semiconductor components 10, the binder 22 is burned off at 300° C. (FIG. 2C; the thermal action is indicated by the arrow 3). This gives rise to a powder layer 2 loosely adhering on the substrate (FIG. 2D), which can be brushed off or rinsed off in the case of unsuitable LEDs. In the case of suitable LEDs, the powder layer 2 is soaked with silicone as a further binder 23 for fixing (FIG. 2E). The silicone 23 is added dropwise to the particular LEDs 10, as indicated in FIG. 2D.

Figure 3A:
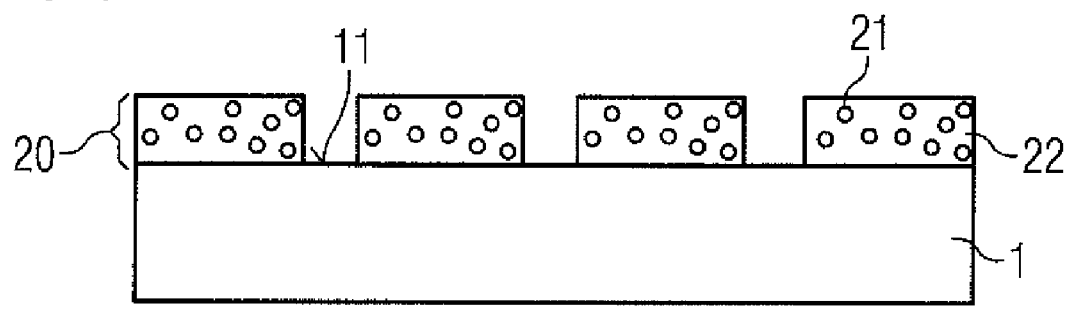

Alternatively to the large-area application of the paste 20 shown in FIG. 2A, the paste 20 can also be applied in a patterned manner as described in the general part, i.e. area by area, as shown in FIG. 3A. The further process steps can then be carried out as described in the preceding embodiment. The substrate 1 can be individualized into individual LEDs 10, for example, after the fixing of the structured powder layer 2 (not shown).

Figure 3B:
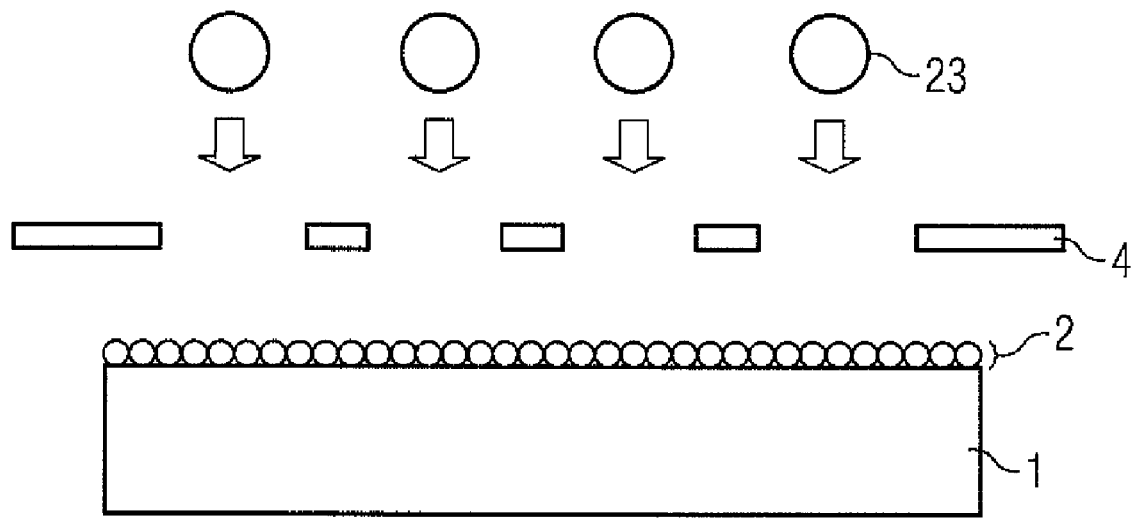

Further, as shown in FIG. 3B, the unstructured, loosely adhering powder layer 2 can be patterned area by area by dropwise application of a further binder 23. In this case, it is possible, for example, to use a mask 4. The regions of the powder layer 2 which are not fixed with the further binder 23 can, as described, be removed after application of the further binder 23. Alternatively, these regions of the powder layer 2 can also be removed before application of the further binder 23.

Figure 4A:
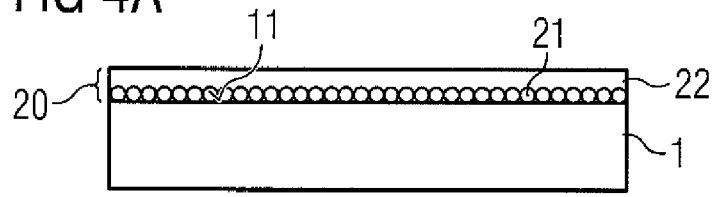
Figure 4B:
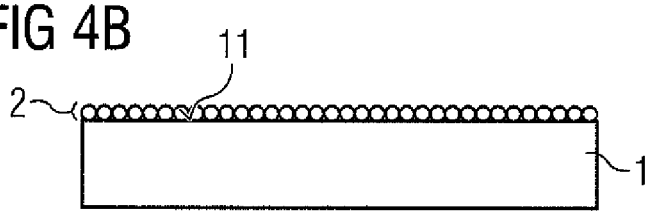
Figure 4C:
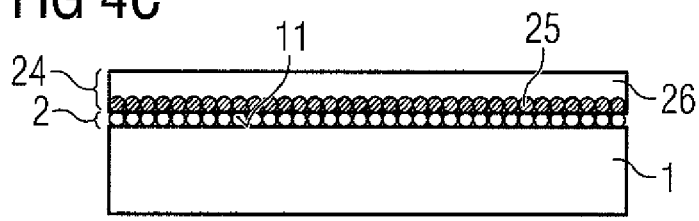
Figure 4D:
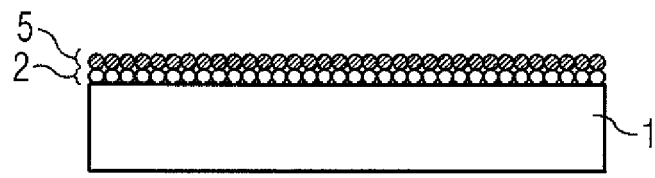
Figure 4E:
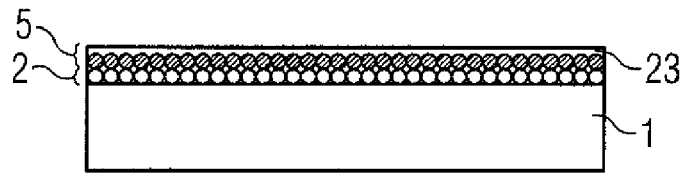

FIGS. 4A to 4E show an embodiment of a process for producing a layer structure with a multilayer structure of powder layers. As described above in connection with FIGS. 2A and 2C, this involves applying a mixture comprising a powder 21 and an adhesion promoter 22 to a substrate surface 11 (FIG. 4A). Removal of the adhesion promoter 22 generates a loose powder layer 2 (FIG. 4B). In turn, a mixture 24 comprising a further powder 25 and a further adhesion promoter 26 is applied thereto (FIG. 4C). The further powder 25 and the further adhesion promoter 26 may each be the same as or different from the powder 21 and the adhesion promoter 22. The removal of the further adhesion promoter 26 generates a further loose powder layer 5 on the powder layer 2. Alternatively to the embodiment demonstrated, it is also possible to obtain further loose powder layers. As demonstrated in the above-described FIGS. 2D and 2E, a further binder 23, which fixes the multilayer structure, is applied to the multilayer structure comprising the multilayer structure composed of two powder layers 2, 5 at least as demonstrated in the embodiment (FIG. 4E). Alternatively, fixing can also be effected by applying the further binder 23 in each case after the application of the loose powder layers 2 and 5.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A process for arranging a powder layer comprising a powder on a substrate surface of a substrate, comprising the steps of:
    a) providing the substrate having the substrate surface;
    b) applying a mixture comprising the powder and an adhesion promoter on the substrate surface through a process selected from the group consisting of dripping, spraying, stamping, printing, and electrophoresis;
    c) removing the adhesion promoter; and
    d) fixing the powder layer on the substrate surface;
    wherein steps b) and c) are performed repeatedly with different powders such that a multilayer structure with a plurality of powder layers comprising the different powders arranged one on top of another is produced.

2. The process as claimed in claim 1, wherein the adhesion promoter is selected from the group consisting of water, organic solvent, inorganic binder and organic binder.

3. The process as claimed in claim 1, wherein the mixture is applied by performing a printing process.

4. The process as claimed in claim 1, wherein the mixture is applied by performing an electrophoresis process.

5. The process as claimed in claim 1, wherein a further binder is applied to the powder layer for fixing.

6. The process as claimed in claim 5, wherein the further binder used is a silicone.

7. The process as claimed in claim 1, wherein the application of the mixture, the removal of the adhesion promoter and/or the fixing of the powder layer are performed area by area.

8. The process as claimed in claim 1, wherein the powder used is a ceramic powder.

9. The process as claimed in claim 8, wherein the ceramic powder used is a powder comprising a ceramic phosphor.

10. The process as claimed in claim 1, wherein process step d) is performed repeatedly in addition to process steps b) and c).

11. The process as claimed in claim 1, wherein the substrate used is a semiconductor substrate.

12. The process as claimed in claim 11, wherein the semiconductor substrate comprises a multitude of semiconductor components.

13. The process as claimed in claim 12, wherein the semiconductor components of the semiconductor substrate are individualized before or after the fixing.

14. The process as claimed in claim 1, wherein the substrate is an LED and the powder layer is a converter layer.

15. The process as claimed in claim 1, wherein step d) is performed as a single step after the multilayer structure with a plurality of powder layers is produced through the repeated performance of steps b) and c) with the different powders.

* * * * *